(12) United States Patent
Hehn et al.

(10) Patent No.: US 7,602,178 B2
(45) Date of Patent: Oct. 13, 2009

(54) MAGNETORESISTIVE SENSOR FOR MEASURING THE STRENGTH OF A MAGNETIC FIELD

(75) Inventors: Michel Hehn, Neuves Maisons (FR); Alain Schuhl, Nancy (FR); Grégory Malinowski, Villiers les Nancy (FR); Christophe Nicot, Quintal (FR); Christophe Duret, Annecy (FR)

(73) Assignee: S.N.R. Roulements, Annecy (FR)

( * ) Notice: Subject to any disclaimer, the term of this patent is extended or adjusted under 35 U.S.C. 154(b) by 377 days.

(21) Appl. No.: 10/548,604

(22) PCT Filed: Mar. 10, 2004

(86) PCT No.: PCT/FR2004/000574

§ 371 (c)(1),
(2), (4) Date: May 17, 2006

(87) PCT Pub. No.: WO2004/083881

PCT Pub. Date: Sep. 30, 2004

(65) Prior Publication Data

US 2007/0159164 A1    Jul. 12, 2007

(30) Foreign Application Priority Data

Mar. 14, 2003 (FR) .................................. 03 03189
Sep. 16, 2003 (FR) .................................. 03 50545

(51) Int. Cl.
*G01R 33/02* (2006.01)

(52) U.S. Cl. ..................................................... 324/252
(58) Field of Classification Search ............ 324/207.21, 324/252; 360/324, 313
See application file for complete search history.

(56) References Cited

U.S. PATENT DOCUMENTS

| 4,103,315 | A  | * | 7/1978 | Hempstead et al. ......... 360/110 |
| 6,452,204 | B1 |   | 9/2002 | Ishiwata et al. |
| 7,034,348 | B2 | * | 4/2006 | Ohba et al. .................. 257/295 |
| 2003/0011941 | A1 | | 1/2003 | Hasegawa et al. |

FOREIGN PATENT DOCUMENTS

| JP | 2001-068759 A | 3/2001 |
| JP | 2001-274478 A | 10/2001 |

* cited by examiner

*Primary Examiner*—Jay M Patidar
(74) *Attorney, Agent, or Firm*—Arent Fox LLP

(57) ABSTRACT

A magnetoresistive sensor for measuring the strength of a magnetic filed includes a stack of a reference element, a separation element and an element sensitive to the magnetic field. The reference element and the sensitive element have, respectively, a first and a second magnetic anisotropy in a first and a second direction. The sensitive element includes the superposition of a layer of a ferromagnetic material and a layer of an antiferromagnetic material which are arranged to obtain a magnetic moment having a component oriented in the direction of the field to be measured that varies reversibly in relation to the strength of the magnetic field to be measured, and linearly in an adjustable field range.

12 Claims, 4 Drawing Sheets

MAGNETORESISTIVE SENSOR FOR MEASURING THE STRENGTH OF A MAGNETIC FIELD

CROSS-REFERENCE TO RELATED APPLICATION

This application is a National Stage entry of International Application No. PCT/FR2004/000574 filed Mar. 10, 2004. The disclosure of the prior application is hereby incorporated herein in its entirety by reference.

The invention concerns a magnetoresistive magnetic field sensor and the use of such a sensor for measuring the strength of a magnetic field.

Historically, magnetoresistive sensors exploit the variation in electrical resistance of a single magnetic material which is induced by variation in the magnetic field to be measured. This is the principle of operation of anisotropic magnetoresistance sensors. However, the variation in resistance is small. Since the discovery of giant magnetoresistance (in 1988) and tunnel magnetoresistance at ambient temperature (1995), other sensor architectures have been devised with variations in resistance of over 50% at ambient temperature.

These sensors comprise the stack of a magnetic reference element, a separation element and a magnetic element sensitive to the magnetic field, said stack being arranged in order to have a variation in electrical resistance in relation to the magnetic field to be measured.

In particular, the stack can comprise two magnetic structures forming respectively the reference element and the sensitive element which are separated by the separation element. In this configuration, the orientation of the magnetic moment of the reference element is arranged so as to be unchanged by the action of the magnetic field to be measured, whilst that of the sensitive element is modifiable by the action of said field.

When the separation element is electrically conductive (a metallic or semiconductive layer for example), the sensor exploits the giant magnetoresistance which expresses the dependency of the current in relation to the relative orientation of the magnetisations of the magnetic structures. And, when the separation element is electrically insulating, the sensor exploits the tunnel magnetoresistance which depends on the interface band structure of the spin up and down electrons and which for a given spin channel depends on the relative orientation of their magnetisation. These sensors are highly sensitive and can a priori be intended for the detection of magnetic fields whose amplitude can vary by several orders of magnitude.

In order to obtain a high-performance magnetoresistive sensor, it is necessary to have control over the relative orientation of the magnetic moments of the magnetic structures, so as to be able to correlate the variation in electrical resistance with the magnetic field to be measured. In particular, a perpendicular orientation of the magnetic anisotropy axis of the reference element with respect to that of the sensitive element makes it possible to linearise the output of the sensor in order to obtain an easily exploitable measurement signal.

The document FR-2 809 185 describes a sensor in which the sensitive element comprises a layer of ferromagnetic material whose magnetic anisotropy comes from the shape energy, and the reference element comprises the superposition of a layer made from ferromagnetic material and a layer made from antiferromagnetic material whose anisotropy results from the exchange between these two layers. According to this document, the shape energy is therefore used to obtain the sensitive element, and the exchange anisotropy is used to obtain the reference element, that is to say obtain a magnetic moment which is fixed in relation to this field.

This solution has several drawbacks from both the point of view of the design of the sensor and that of the performance of the measurement obtained.

As regards the design, the use of the shape energy for inducing the anisotropy of the sensitive element proves difficult and expensive to implement. This is because, as explained by the document FR-2 809 185, this requires the use of neighbouring disoriented Si(111) surfaces; however this substrate is particularly expensive and difficult to use industrially. This is because heat treatment at high temperature (900° C.) with a slow lowering of temperature is necessary to obtain the accumulation of steps necessary for observing the shape anisotropy. Moreover, this use imposes a particular anisotropy direction, which is detrimental to the modularity of the sensor. Furthermore, these substrates are not adapted to an integration of the sensitive element on an ASIC for processing the signal.

As regards the measurement performance, it turns out that the range of use of the known sensor is difficult to adapt, and that in any case it remains relatively limited. In particular, this range of use depends on the size of the sensor which also prejudices the modularity of the sensor. Moreover, the disposition of the antiferromagnetic layer on the upper part of the stack poses problems of reliability of the measurement. This is because it has been shown that a texture of the antiferromagnetic layer is necessary for a strong blocking and therefore for an operating range at high temperature. However, when the antiferromagnetic layer is disposed on top of an amorphous insulating layer, the texture is lost, the blocking is poorer and the sensor no longer functions for temperatures a little higher than the ambient temperature.

In order to resolve all these drawbacks, the invention proposes a magnetoresistive sensor in which the magnetic anisotropy of the sensitive element is induced by the exchange which exists at an interface between a layer of ferromagnetic material and a layer of antiferromagnetic material.

To that end, and according to a first aspect, the invention proposes a magnetoresistive magnetic field sensor comprising a stack of a reference element, a separation element and an element sensitive to the magnetic field, in which the reference element and the sensitive element have respectively a first and a second magnetic anisotropy in a first and a second direction. The sensitive element comprises the superposition of a layer of a ferromagnetic material and a layer of an antiferromagnetic material which is arranged in order to obtain a magnetic moment whose component oriented in the direction of the field to be measured varies linearly and reversibly in relation to the strength of the magnetic field to be measured, and linearly in an adjustable field range.

According to a second aspect, the invention proposes the use of such a sensor for measuring the strength of a magnetic field, in which the anisotropy direction of the reference element is disposed parallel to the direction of the magnetic field to be measured.

Other objects and advantages of the invention will emerge in the course of the following description, given with reference to the accompanying drawings, in which.

Figure 1:
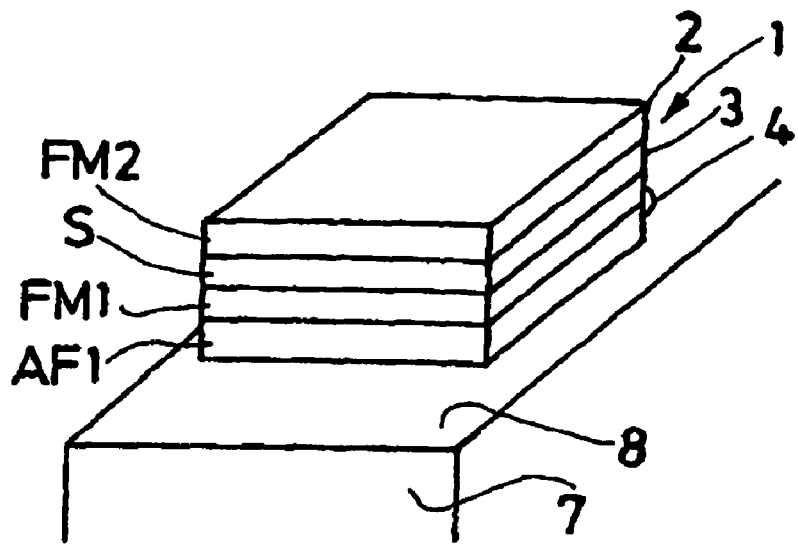
FIGS. 1 and 2 are perspective views showing schematically respectively a first and a second implementation of a stack of layers disposed on a substrate for the implementation of a sensor according to the invention.

The property more particularly of interest here is the response obtained when a ferromagnetic material FM1 and an antiferromagnetic material AF1 have a common interface when the field is applied perpendicular to the magnetic axis exhibiting exchange. In this case, the process of reversal of the magnetisation by nucleation and propagation of walls (reversal when the field is applied along the magnetic axis exhibiting exchange) is replaced by the reversible rotation of the magnetisation (reversal when the field is applied perpendicular to the magnetic axis exhibiting exchange). Hysteretic behaviour is then replaced by the reversible behaviour of FIG. 4a. Moreover, in a fairly wide field range, the signal is linear.

Formally, the gradient of the response of the magnetisation with the applied field is given by:

$$\left.\frac{\partial M}{\partial H}\right|_{H=0} = \left(2\frac{K_F}{M_S} + \frac{J}{t_F M_S}\right)^{-1} \quad (1)$$

where $M_S$ is the saturation magnetisation of the ferromagnetic layer FM1, $t_F$ is the thickness of the ferromagnetic layer FM1, $K_F$ is the anisotropy constant of the ferromagnetic layer FM1 and J is the coupling existing between the ferromagnetic layer and the antiferromagnetic layer. When $K_F=0$, it is possible to ascertain analytically the component of the magnetisation of the layer FM1 in the direction of the applied field, i.e.

$$m(H) = \sin\left(\arctan\left(\frac{t_F M_S}{J}H\right)\right) \quad (2)$$

Thus the creation of a ferromagnetic/antiferromagnetic common interface induces a magnetic anisotropy axis, the direction of which is controllable in the ferromagnetic layer. The response in a small amplitude magnetic field is reversible with a gradient, and therefore a sensitivity of the future sensor, which is adjustable by the function of $M_S$, $t_F$ and J.

The invention concerns a magnetoresistive magnetic field sensor which comprises a stack 1 of a reference element 2, a separation element 3 and an element 4 sensitive to the magnetic field. The reference element 2 and the sensitive element 4 have respectively a first 5 and a second 6 magnetic anisotropy in a first and a second direction.

This type of sensor is arranged so that, under the effect of the magnetic field to be measured, the direction of the magnetisation 10 of the sensitive element 4 varies with respect to that of the reference element 2, which induces a variation in electrical resistance of the stack 1 in relation to the strength of said field.

According to a first implementation, the separation element 3 comprises a layer S of an electrically insulating material, for example based on oxidised and/or nitrated aluminium, oxidised gallium, oxidised tantalum, oxidised magnesium or oxidised strontium titanate. The magnetoresistive sensor then exploits the tunnel magnetoresistance properties of the junction formed by the two magnetic elements 2, 4 separated by the insulating layer S. In this implementation, the resistance measurements are made perpendicular to the plane of the layer S.

According to a second implementation, the separation element 3 is formed from a layer S of electrically conductive material, for example based on metals such as copper or based on semiconductors. The magnetoresistive sensor then exploits the giant magnetoresistance properties of the "spin valve" formed by the two magnetic elements 2, 4 separated by the conductive layer S. In this implementation, the resistance measurements are made either perpendicular to the plane of the layer S or parallel thereto.

In these two implementations, the magnetoresistive effect brings about a variation in the electrical resistance of the stack 1 in relation to the magnetic field to be measured, said variation being exploited in an electronic processing circuit in order to obtain the strength of said field. In a particular manner, exploitation of the variation in resistance is facilitated by making provision that, in the absence of a magnetic field to be measured, the first anisotropy 5 is perpendicular to the second anisotropy 6.

In connection with FIG. 1, a description is given of a first embodiment of the stack 1 which comprises a layer of ferromagnetic material FM2 as the reference element 2, and the superposition of a layer of a ferromagnetic material FM1 and a layer of an antiferromagnetic material AF1 as the sensitive element 4. The ferromagnetic materials FM1, FM2 are for example based on cobalt, iron, nickel or an alloy of these materials. The ferromagnetic materials of the reference element 2 and of the sensitive element 4 can be identical or different in nature depending on the characteristics desired for the sensor. The antiferromagnetic material can be based on IrMn, FeMn, PtMn, NiMn or other manganese-based compounds.

When a ferromagnetic material and an antiferromagnetic material have a common interface, it is possible to observe an effect referred to as "exchange bias" which is manifested principally by a displacement in the magnetic field of the hysteresis cycle. The ferromagnetic layer FM1 then has an anisotropy direction 6 imposed by the antiferromagnetic material AF1. This anisotropy direction 6 has the advantage of being controllable, either by saturating the magnetisation of the ferromagnetic layer FM1 during deposition of the layer AF1, or by a heat treatment under a magnetic field after deposition where the sample is heated to a temperature higher than the blocking temperature of the antiferromagnetic material AF1 before being cooled below this temperature. During this cooling, it should be ensured that the magnetisation of the ferromagnetic layer FM1 is saturated in the direction desired for the anisotropy of the layer.

The stack 1 is deposited on a substrate 7, for example one made from silicon or glass, the layer of antiferromagnetic material AF1 being disposed on the substrate. To do this, a vacuum cathode sputtering technique can be used, which makes it possible to successively deposit thin layers of desired materials. As regards the deposition of an oxidised aluminium layer, provision can be made to deposit a layer of aluminium by vacuum cathode sputtering, and then oxidise this layer under oxygen.

In order to limit the formation of defects in the layer of antiferromagnetic material AF1, it can be envisaged to deposit on the substrate 7 a buffer layer, for example an amorphous tantalum film 8, which is intended to improve the condition of the surface on which the antiferromagnetic material AF1 is disposed.

In this embodiment, the anisotropy 5 of the reference element 2 is obtained either by depositing the layer of ferromagnetic material FM2 under a magnetic field so as to orient this anisotropy 5 in the direction of the applied magnetic field, or by inducing a shape anisotropy in the layer of ferromagnetic material FM2, for example by making provision that the reference element 2 has a larger dimension in the direction of the anisotropy 5. The reference element 2 is arranged in order to have a higher coercive field than the field range to be measured. Thus, by applying a magnetic field, a modification of the orientation of the magnetic moment of the sensitive element 4 can be induced without modifying the magnetic moment of the reference element 2.

As an example, the following magnetic tunnel junction was implemented:

Glass/Ta (5 nm)/Co (10 nm)/IrMn (10 nm)/Co (10 nm)/ AlOx/Co (2 nm)/$Co_{80}Pt_{20}$ (5 nm)/Pt (4 nm).

The glass constitutes the substrate and the Ta/Co bilayer is the buffer layer. The sensitive element consists of the IrMn (10 nm)/Co (10 nm) bilayer. The Co (2 nm)/$Co_{80}Pt_{20}$ (5 nm) reference element consists of cobalt with platinum added to increase the coercive field. The Pt (40 nm) layer is a protective layer.

The layers were deposited by cathode sputtering at ambient temperature under a base pressure below $5 \times 10^{-7}$ mbar. The argon pressure during deposition was $5 \times 10^{-3}$ mbar.

To obtain the insulating layer (AlOx), oxidation was carried out after deposition of a 1.3 nm metallic layer using a continuous luminescent discharge at 300 W for 35 seconds under pure oxygen plasma at $10^{-1}$ mbar in a cathode sputtering chamber. The sample was transferred into this chamber without breaking the vacuum.

After growth, the sample was heat-treated for 30 minutes at 200° C. in the presence of a 300 Oe magnetic field in order to establish the "exchange bias" in the IrMn layer and to orient the anisotropy direction of this layer perpendicular to the anisotropy direction of the Co (2 nm)/$Co_{80}Pt_{20}$ (5 nm)/Pt (4 nm) layer.

The shaping of the junction was performed in a known manner by UV lithography and ion beam etching.

Figure 2:
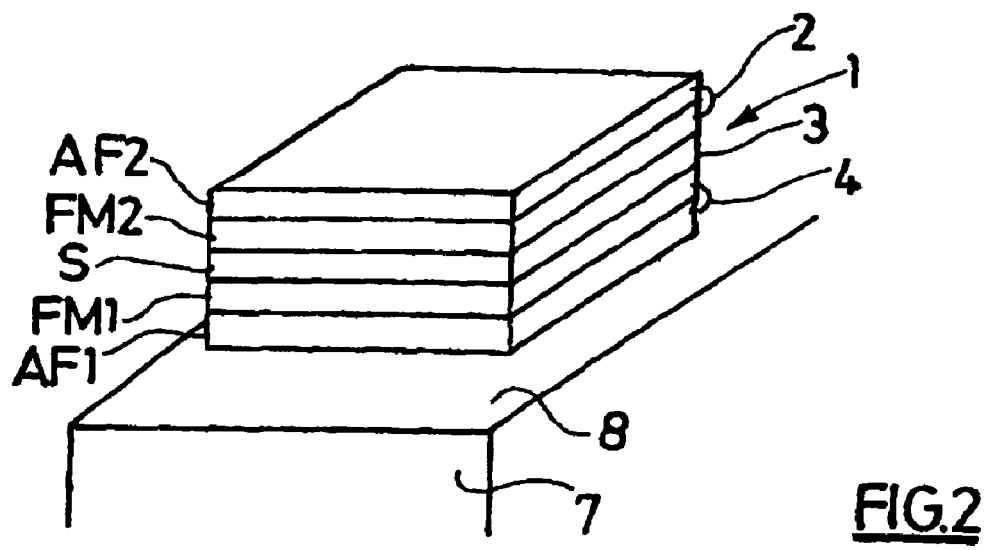

According to the second embodiment depicted in FIG. 2, the reference element 2 comprises the superposition of a layer of a ferromagnetic material FM2 and a layer of an antiferromagnetic material AF2, and the sensitive element 4 is analogous to that depicted in FIG. 1. This implementation makes it possible to obtain a greater stability of the reference element 2 as regards the magnetic field to be measured (FIG. 5b).

In this embodiment, the sensor therefore comprises the stack AF1/FM1/S/FM2/AF2, the antiferromagnetic materials AF1 and AF2 having blocking temperatures, respectively T1 and T2, which are different, for example with T1>T2. To obtain the magnetic configuration depicted in FIG. 3, the procedure below can be followed:

the stack 1 is heat-treated at a temperature T>T1 under a magnetic field so as to induce an anisotropy respectively in the sensitive element 4 and in the reference element 2 which is parallel to the applied magnetic field; then the stack is heat-treated at a temperature T between T1 and T2 under a magnetic field perpendicular to that applied in the previous step, so as to induce an anisotropy 5 in the reference element 2 which is parallel to the applied magnetic field and therefore perpendicular to the anisotropy 6 of the sensitive element 4.

In these two embodiments, the sensitive element 4 is arranged so that its magnetic moment 10 varies in relation to the magnetic field to be measured, and the reference element 2 is arranged so that the direction and sense of its magnetic moment 9 are fixed in relation to the magnetic field to be measured.

These characteristics are obtained, in relation to the strength of the magnetic field to be measured, by varying the nature of the materials used and/or the thickness of the different layers. In particular, the thicknesses of the layers can be of the order of 10 nm and be arranged in order to obtain the desired junction, tunnel or giant magnetoresistance, in the strength range of the magnetic field to be measured.

Figure 3:
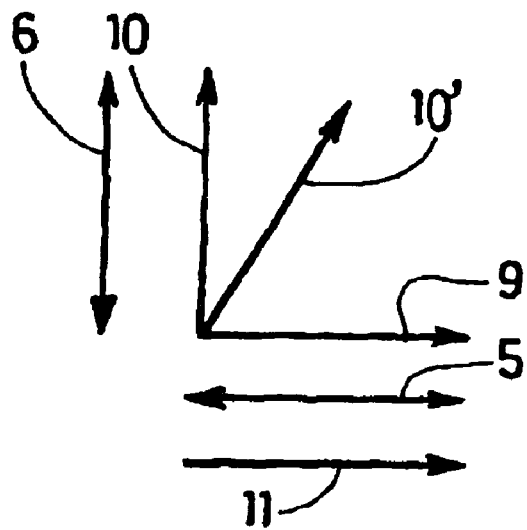
FIG. 3 is a diagram of the magnetic configuration of the anisotropy axes, the magnetisations and the magnetic field to be measured in the stacks according to FIG. 1 or 2.

FIG. 3 depicts a possible magnetic configuration for the anisotropy axes 5, 6 and the magnetisations 9, 10 respectively of the reference element 2 and sensitive element 4. In this configuration, under zero magnetic field, the magnetic moments 10, 9 are perpendicular. When a magnetic field to be measured 11 is applied in a fixed direction parallel to the direction of the anisotropy 5 of the reference element 2, there results therefrom a rotation of the magnetic moment 10 of the sensitive layer 4 (to a position 10'), whilst the magnetisation 9 of the reference layer 2 remains fixed.

Figure 4A:
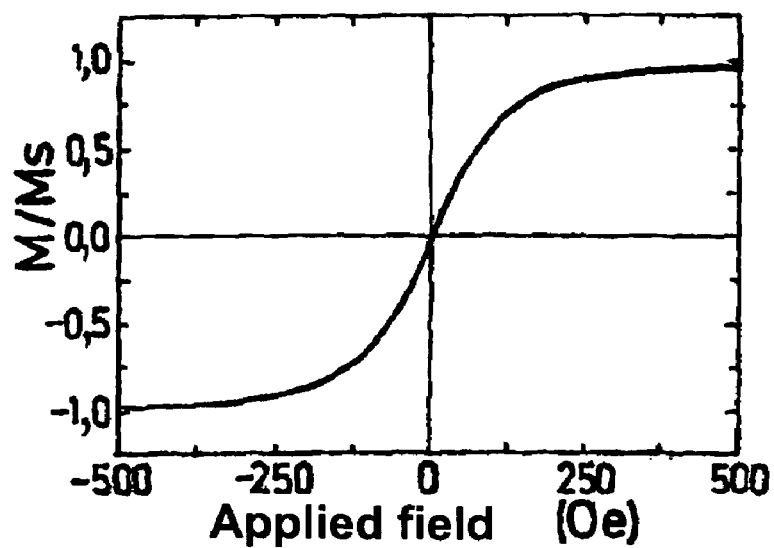
FIGS. 4a and 4b depict the variation, in relation to the magnetic field to be measured, in the magnetisation respectively of the sensitive element and of the reference element according to the configuration of FIG. 3 and for the stack of FIG. 1.
Figure 4B:
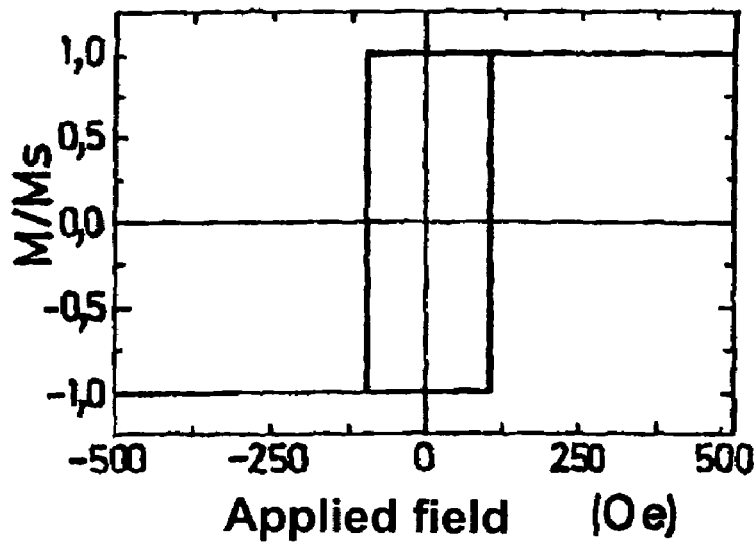
Figure 5A:
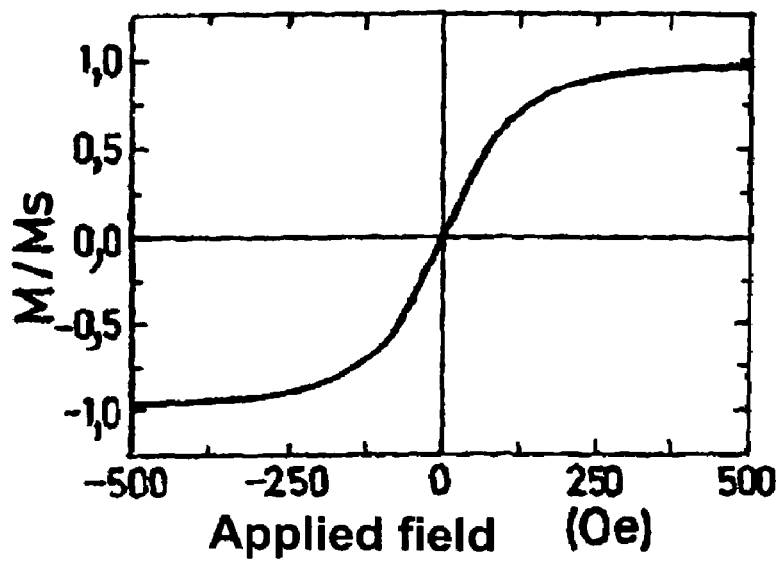
FIGS. 5a and 5b depict the variation, in relation to the magnetic field to be measured, in the magnetisation respectively of the sensitive element and of the reference element according to the configuration of FIG. 3 and for the stack of FIG. 2.
Figure 5B:
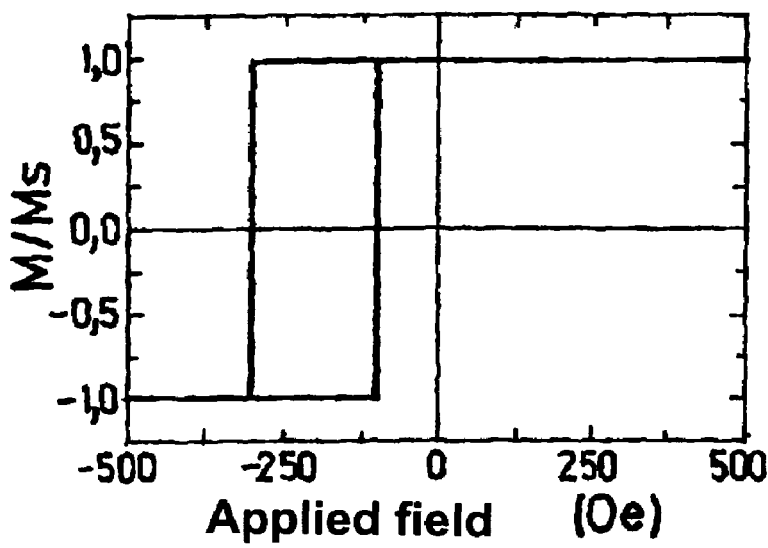

As can be seen in FIGS. 4a and 5a, the variation in magnetisation of the sensitive element 4 in the direction of the applied field is linear over a broad range of variation in the strength of the field to be measured (between −50 and +50 Oe in FIGS. 4a and 4b) whilst the magnetisation of the reference element 2 remains constant over this range (FIGS. 4b and 5b). As regards the magnetisation of the reference element 2 (FIG. 4b), the coercive field, which corresponds to the reversal of the magnetisation under the effect of the field to be measured, is of the order of 100 Oe (FIG. 4b) or 300 Oe (FIG. 5b), that is well beyond the linearity range of FIG. 4a.

Figure 6:
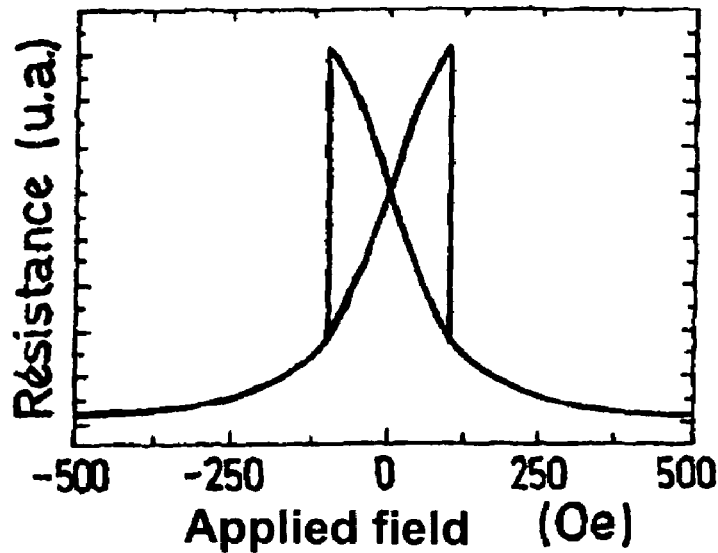
FIG. 6 depicts the variation, in relation to the magnetic field to be measured, in the electrical resistance of the junction which results from the magnetisation variations depicted in FIGS. 4a and 4b.
Figure 7:
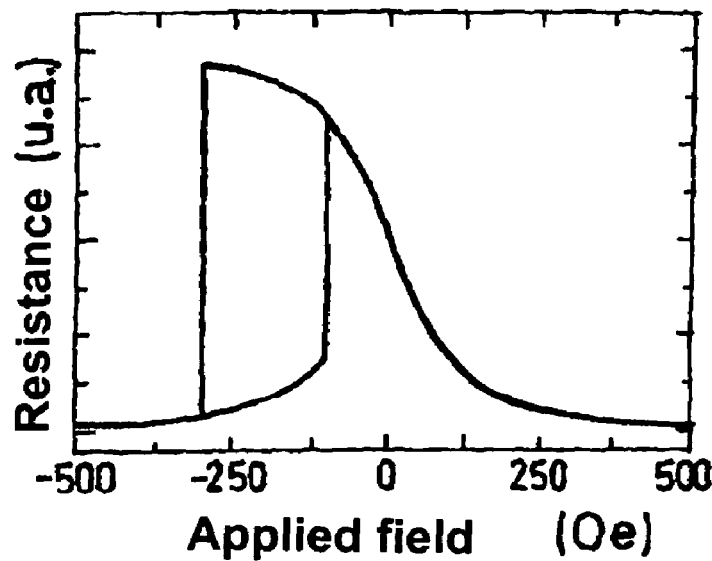
FIG. 7 depicts the variation, in relation to the magnetic field to be measured, in the electrical resistance of the junction which results from the magnetisation variations depicted in FIGS. 5a and 5b.

Consequently, a variation is obtained in the resistance of a stack 1 according to the invention as depicted in FIGS. 6 and 7 which comprises as an important characteristic the fact of having a linear and reversible response over a large range of field strength to be measured (between −50 and +50 Oe). This variation law can therefore be used in a particularly simple manner in an electronic processing circuit to obtain the strength of the magnetic field in relation to the resistance of the stack 1, since the variation in resistance is linear in relation to the strength of the magnetic field to be measured.

It can furthermore be shown that the total sensitivity S of the sensor breaks down into an electrical sensitivity $S_e$ and a magnetic sensitivity $S_m$ so that $S=S_e \times S_m$, with $S_e=(R_P-R_{AP})/2$ and $S_m=1/H_{ex}$ where $R_P$ and $R_{AP}$ are the resistances of the junction for the parallel and antiparallel alignments respectively of the magnetisations of the reference element and the sensitive element and $H_{ex}=J/(M_s t_F)$ is the effective exchange field in the IrMn/Co bilayer.

The magnetic sensitivity and the electrical sensitivity were measured independently on the sample described above. To that end, the resistance in relation to the field was measured at different temperatures with an applied field parallel to the anisotropy direction of the antiferromagnetic layer of the sensitive element in order to have access to $(R_P-R_{AP})/2$ and $H_{ex}$ unambiguously.

Figure 8:
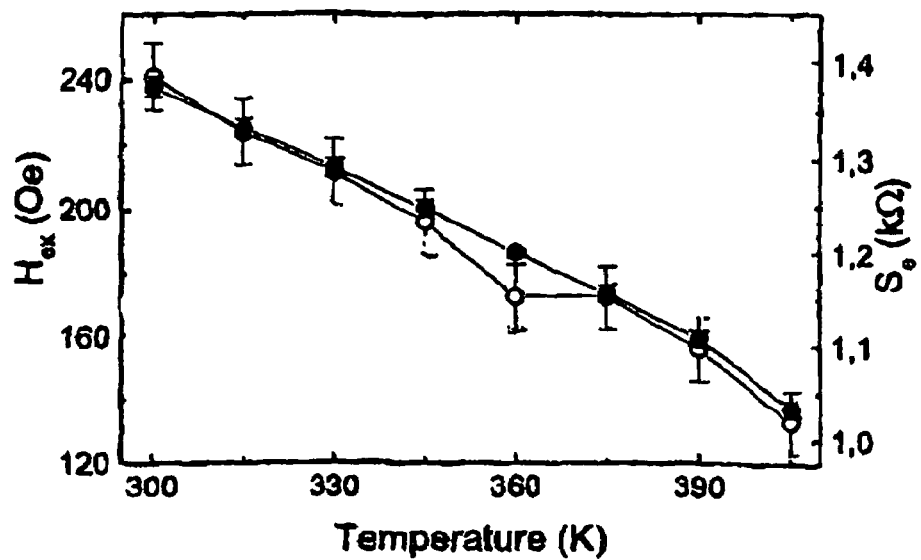
FIG. 8 illustrates the variations in the electrical and magnetic sensitivities of a sensor according to the invention in relation to the temperature.

FIG. 8 illustrates the results obtained. In this figure, the curve (•) represents the electrical sensitivity, and the curve (○) represents the inverse of the magnetic sensitivity, for temperatures up to 430K.

Figure 9:
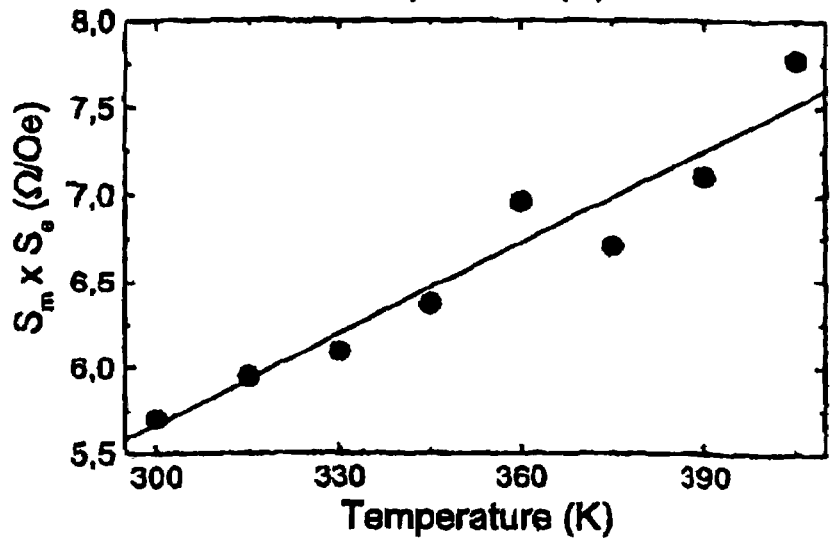
FIG. 9 illustrates the variation in its total sensitivity with temperature.

The magnetic sensitivity varies linearly with temperature. Astonishingly, the same applies for the electrical sensitivity. Thus, the total sensitivity also varies linearly (in the present case it increases, as shown in FIG. 9) with temperature.

In fact, a fine analysis of FIG. 8 shows that the resistance of the junction varies in relation to the temperature according to a law $$R(T) = R(0)\left(1 - C\frac{d}{\sqrt{\Phi}}T^2\right)$$

where C is a constant, d is the thickness of the insulating layer, and $\Phi$ is the height of the junction barrier in eV.

Consequently, it is possible to set the gradient of $S_e$ by modifying the parameters d and $\Phi$ of the barrier, and in particular its thickness. For a junction having a given barrier height, it is therefore possible to determine the thickness of the insulating layer so that the gradient of $S_e$ in relation to the temperature compensates for that of $S_m$ and the total sensitivity of the sensor is independent of temperature.

Figure 10:
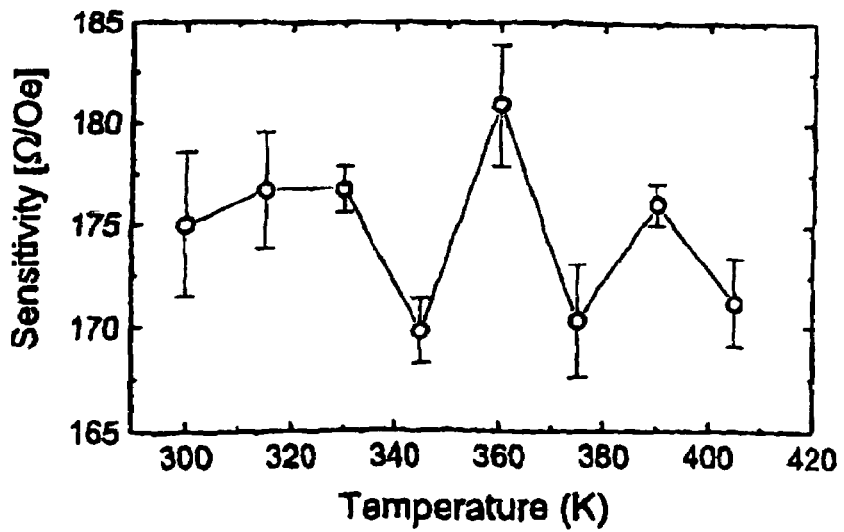
FIG. 10 illustrates the variation in the total sensitivity of an optimised sensor with temperature.

The variation in relation to temperature of the total sensitivity of the sample described above is illustrated in FIG. 10 where it can be noted that it is practically non-existent.

The invention claimed is:

1. A magnetoresistive sensor for measuring a magnetic field strength, comprising:
   a stack of a reference element,
   a separation element, and
   an element sensitive to the magnetic field,
   wherein the reference element and the sensitive element have, respectively, a first and a second magnetic anisotropy in a first and a second direction, and
   wherein the sensitive element comprises a layer of a ferromagnetic material superposed with a layer of an antiferromagnetic material arranged to obtain a magnetic moment having a component oriented in a direction of a magnetic field to be measured that varies reversibly in relation to a strength of the measured magnetic field and linearly in an adjustable field range.

2. A sensor according to claim 1, wherein the first anisotropy is perpendicular to the second anisotropy.

3. A sensor according to claim 1, wherein the reference element comprises another layer of a ferromagnetic material having a magnetisation direction that is fixed relative to the measured magnetic field.

4. A sensor according to claim 1, wherein the reference element comprises another layer of a ferromagnetic material superposed with a second layer of an antiferromagnetic material arranged to obtain a magnetisation direction that is fixed relative to the measured magnetic field.

5. A sensor according to claim 4, wherein a blocking temperature of the first layer of antiferromagnetic material of the sensitive element is different from a blocking temperature of the second layer of antiferromagnetic material of the reference element.

6. A sensor according to any one of claims 1 to 5, wherein the first layer of antiferromagnetic material of the sensitive element is disposed on a substrate.

7. A sensor according to claim 6, wherein the substrate comprises an additional layer of a material which improves a condition of a surface on which the first layer of antiferromagnetic material is disposed.

8. A sensor according to any one of claims 1 to 5, wherein the separation element is formed from a layer of electrically conductive material.

9. A sensor according to any one of claims 1 to 5, wherein the separation element comprises a layer of electrically insulating material.

10. A sensor according to claim 9, wherein the sensor has a sensitivity substantially independent of temperature.

11. A sensor according to claim 10, wherein a thickness of the separation element is such that, depending on a barrier height of a magnetic tunnel junction constituted by the stack of the reference element, the separation element and the sensitive element, variation with temperature of the electrical sensitivity of the sensor substantially compensates for the variation with temperature of the magnetic sensitivity of the sensor.

12. Use of a sensor according to claim 1 for measuring the strength of a magnetic field, in which the anisotropy direction of the reference element is disposed parallel to the direction of the magnetic field to be measured.

* * * * *